United States Patent
Kim et al.

(10) Patent No.: US 6,584,003 B1
(45) Date of Patent: Jun. 24, 2003

(54) LOW POWER CONTENT ADDRESSABLE MEMORY ARCHITECTURE

(75) Inventors: Jin-Ki Kim, Ottawa (CA); Peter Vlasenko, Kanata (CA); Douglas Perry, Ottawa (CA); Peter B. Gillingham, Kanata (CA)

(73) Assignee: Mosaid Technologies Incorporated, Kanata (CA)

( * ) Notice: Subject to any disclaimer, the term of this patent is extended or adjusted under 35 U.S.C. 154(b) by 0 days.

(21) Appl. No.: 10/134,753

(22) Filed: Apr. 30, 2002

Related U.S. Application Data

(60) Provisional application No. 60/342,750, filed on Dec. 28, 2001.

(51) Int. Cl.[7] .............................................. G11C 15/00
(52) U.S. Cl. ........................................ 365/49; 365/203
(58) Field of Search ................................. 365/49, 203

(56) References Cited

U.S. PATENT DOCUMENTS

| | | | |
|---|---|---|---|
| 5,471,189 A | | 11/1995 | Dietz et al. |
| 5,517,441 A | | 5/1996 | Dietz et al. |
| 5,659,697 A | | 8/1997 | Dietz |
| 5,726,942 A | * | 3/1998 | Yoneda et al. ............... 365/208 |
| 6,191,969 B1 | | 2/2001 | Pereira |
| 6,243,280 B1 | | 6/2001 | Wong et al. |
| 6,307,798 B1 | * | 10/2001 | Ahmed et al. ............... 365/207 |
| 6,339,539 B1 | * | 1/2002 | Gibson et al. ............... 365/49 |
| 6,400,594 B2 | * | 6/2002 | Hata et al. ..................... 365/49 |
| 6,442,054 B1 | * | 8/2002 | Evans et al. ................... 365/49 |
| 6,452,822 B1 | | 9/2002 | Chai et al. |

* cited by examiner

Primary Examiner—Son T. Dinh
Assistant Examiner—Tuan T. Ng
(74) Attorney, Agent, or Firm—Leslie Anne Kinsman; Borden Ladner Gervais LLP

(57) ABSTRACT

A low power CAM architecture is disclosed. Matchlines of the CAM array are sequential into a main search portion and a main search portion. After issuing a search command, a main search operation is conducted on the main search portion of the matchline. If the result of the main search is a match, then the main search is subsequently conducted on the main search portion of the matchline. If the result of main search is a mismatch, then the main search is disabled, and consequently there is no power dissipation on the main search portion of the matchlines. Main search and main search operations can be pipelined to maintain high throughput with minimum latency. Power consumption is further reduced by using a matchline sense circuit for detecting a current on the main search and main search portions of the matchline. Matchlines are decoupled from the sense circuit sense node in order to achieve higher sensing speed and improved sense margins, and dummy matchlines are used to generate timed control signals for latching the output of the matchline sense circuits. The matchlines are initially precharged to a miss condition represented by ground potential and are then undergo accelerated precharge to a preset voltage potential level below VDD to overcome tail-out parasitic current and to minimize the voltage swing of the matchlines to conserve power.

12 Claims, 13 Drawing Sheets

LOW POWER CONTENT ADDRESSABLE MEMORY ARCHITECTURE

This application claims the benefit of 60/342,750 filed Dec. 28, 2001.

FIELD OF THE INVENTION

The present invention relates to content addressable memories (CAM). More particularly the invention relates to a CAM architecture for reducing power consumption.

BACKGROUND OF THE INVENTION

In many conventional memory systems, such as random access memory, binary digits (bits) are stored in memory cells, and are accessed by a processor that specifies a linear address that is associated with the given cell. This system provides rapid access to any portion of the memory system within certain limitations. To facilitate processor control, each operation that accesses memory must declare, as a part of the instruction, the address of the memory cell/cells required. Standard memory systems are not well designed for a content based search. Content based searches in standard memory require software based algorithmic search under the control of the microprocessor. Many memory operations are required to perform a search. These searches are neither quick nor efficient in using processor resources.

To overcome these inadequacies an associative memory system called Content Addressable Memory (CAM) has been developed. CAM allows cells to be referenced by their contents, so it has first found use in lookup table implementations such as cache memory subsystems and is now rapidly finding use in networking systems. CAM's most valuable feature is its ability to perform a search and compare of multiple locations as a single operation, in which search data is compared with data stored within the CAM. Typically search data is loaded onto search lines and compared with stored words in the CAM. During a search-and-compare operation, a match or mismatch signal associated with each stored word is generated on a matchline, indicating whether the search word matches a stored word or not. A typical word of stored data includes actual data with a number appended header bits, such as an "E" bit or empty bit for example, although the header bits are not specifically searched during search-and-compare operations.

A CAM stores data in a matrix of cells, which are generally either SRAM based cells or DRAM based cells. Until recently, SRAM based CAM cells have been most common because of their simple implementation. However, to provide ternary state CAMS, ie. where each CAM cell can store one of three values: a logic "0", "1" or "don't care" result, ternary SRAM based cells typically require many more transistors than ternary DRAM based cells. As a result, ternary SRAM based CAMs have a much lower packing density than ternary DRAM based cells.

A typical CAM block diagram is shown in FIG. 1. The CAM 10 includes a matrix, or array 25, of DRAM based CAM cells (not shown) arranged in rows and columns. An array of DRAM based ternary CAM cells have the advantage of occupying significantly less silicon area than their SRAM based counterparts. A predetermined number of CAM cells in a row store a word of data. An address decoder 17 is used to select any row within the CAM array 25 to allow data to be written into or read out of the selected row. Data access circuitry such as bitlines and column selection devices, are located within the array 25 to transfer data unto and out of the array 25. Located within CAM array 25 for each row of CAM cells are matchline sense circuits, which are not shown, and are used during search and compare operations for outputting a result indicating a successful or unsuccessfully match of a search word against the stored word in the row. The results for all rows are processed by the priority encoder 22 to output the address (Match Address) corresponding to the location of a matched word. The match address is stored in match address registers 18 before being output by the match address output block 19. Data is written into array 25 through the data I/O block 11 and the various data registers 15. Data is read out from the array 25 through the data output register 23 and the data I/O block 11. Other components of the CAM include the control circuit block 12, the flag logic block 13, the voltage supply generation block 14, various control and address registers 16, refresh counter 20 and JTAG block 21.

FIG. 2 depicts a hierarchical view of the typical CAM array 25. CAM array 25 includes a matrix of CAM cells 30 and a matchline sense circuit block 26. CAM cells 30 of the CAM array 25 are arranged in rows and columns. CAM cells 30 of a row are connected to a common matchline MLi, word line WLi and tail line TLi, and CAM cells 30 of a column are connected to a common pair of search lines SLj*/SLj and a common pair of bitlines BLj/BLj*, where i is an integer value between 0 and n, and j is an integer value between 0 and m. Located adjacent to the CAM array 25 for each row is matchline sense circuit block 26. Matchline sense circuit block 26 includes one matchline sense circuit 27 connected to a respective matchline MLi, and is used during search-and-compare operations for outputting match signals ML OUT0-ML OUTn which indicate a successful or unsuccessful match of a search word against the stored word. Matchlines MLi and tail lines TLi are connected to their respective matchline sense circuits 27, and tail lines TLi can be selectively connected to ground potential. Although not shown in the simplified schematic of FIG. 2, the matchline sense circuits 27 also receive control signals to control their operation, and a person skilled in the art would understand that such control signals to be necessary for their proper operation of the circuit.

FIG. 3 shows a typical ternary DRAM type CAM cell 30 as described in issued U.S. Pat. No. 6,320,777 B1. Cell 30 has a comparison circuit which includes an n-channel search transistor 31 connected in series with a n-channel compare transistor 32 between a matchline ML and a tail line TL. A search line SL* is connected to the gate of search transistor 31. The storage current includes a n-channel access transistor 33 having a gate connected to a wordline WL and connected in series with capacitor 34 between bitline BL and a cell plate voltage potential VCP. Charge storage node CELL1 is connected to the gate of compare transistor 32 to turn on transistor 32 if there is charge stored on capacitor 34 i.e. if CELL is logic "I". The remaining transistors and capacitor replicate transistors 31, 32, 33 and capacitor 34 for the other half of the ternary data bit, and are connected to corresponding lines SL and BL* and are provided to support ternary data storage. Together they can store a ternary value representing logic "1", logic "0", or "don't care".

| Ternary Value | CELL 1 | CELL 2 |
|---|---|---|
| 0 | 0 | 1 |
| 1 | 1 | 0 |
| "Don't Care" | 0 | 0 |

The tail line TL is typically connected to ground and all the transistors are n-channel transistors. The description of the operation of the ternary DRAM cell is detailed in the aforementioned issued patent 6,322,771 B1.

As matchlines become longer with increasing memory densities, so does the parasitic capacitance for the longer matchlines. The additional loading of the matchlines due to the increased parasitic capacitance presents several design problems associated with matchline sensing. First, the current of a single conduction path produced by a non-match CAM cell between the matchline and VSS is approximately 10 $\mu$A. Hence the matchline sense amplifier must be sensitive enough to detect this small current. Second, the operating frequency of the CAM chip should be high, in other words, the working cycle of the matchline sense amplifier should be as short as possible to attain high CAM performance. Third, because all matchlines of the CAM chip are active at the same time during search-and-compare operations, the matchline voltage swing should be kept as low as possible to minimize power dissipation. Fourth, sensing should be stable and have good sensing margins for reliable sensing. Fifth, the matchline sense amplifier circuit should be simple and small enough to fit into a tight pitch CAM core layout to minimize area consumption and resulting cost. Even though the voltage swing on matchlines is kept low, power consumption still remains high due to the fully parallel searches executed by the CAM. One of the fundamental challenges for high capacity CAM's is minimizing power consumption due to the repeated charging and discharging of match lines during search and compare operations. The power consumption of the CAM increases proportionally as the memory capacity is increases.

There are two main sources of substantial power consumption during search operations in CAM's. Power consumed by match lines and power consumed by search lines. Conventionally, all match lines are precharged to a logic 'H' state (a match condition), and then the comparison with search data is allowed to pull match lines to a logic 'L' state (a must condition).

In most CAM applications "misses" occur more frequently than "hits". Precharging match lines to a logic 'H' and discharging match lines to logic 'L' for misses tends to generate high power consumption due to the high current associated with charging and discharging all match lines for each search operation. In addition, with an increased number of cells connected to each match line for wider-word CAM applications, the capacitance for match lines increases accordingly, which in turn increases the current required to charge and discharge the match lines. Various solutions have been proposed for reducing the power consumed during search operations, such as segmenting match lines into multiple segments and activating segments sequentially based on match or miss results of previous segments.

For example, a segmented match line architecture is described in U.S. Pat. No. 6,243,280 (Wong et al.)., wherein rows of the CAM are partitioned into a plurality of segments. For each match line, the first of the plurality of match line segments is precharged and a search operation is performed on the first segment. In case of a match in the first segment, the second match line segment is selectively precharged and searching proceeds to the second segment. If there is a match in the second segment, a third segment is precharged and searching proceeds in a similar manner until all segments of a match line have been searched. Precharging of a subsequent segment therefore only occurs in case of a match result in a previous segment. In the case of a match in all segments, selective precharging each segment to a logic 'H' however still requires a large current. Furthermore, a significant delay is introduced in the search time by having to wait for the selective precharge to occur in a segment before proceeding with the actual comparison in that segment.

In U.S. Pat. No. 6,191,970 (Perena) a match line is divided into multiple segments all of which are simultaneously precharged to a logic 'H' state prior to beginning a search operation. In addition, each CAM cell has an associated discharge circuit for selectively discharging its corresponding match line segment in response to a disable signal from a previous match line segment. A segment therefore is only discharged if the immediately preceding segment results in a miss while all subsequent segments remain precharged to a logic 'IL'. As a result, the miss condition of one segment is propagated along the remainder of the row without discharging all other segments along the row. While this approach alleviates the problem of delays introduced by selectively precharging segments, the potential for high current consumption still remains, since all match lines must first be precharged to a logic 'H' state. In addition, the match detect of each segment must be synchronized to a clock signal, clocked since the match line precharges to a hit. As a result, either a number of internal clocks must be generated, or the system clock must be used with increases system latency. Finally, in order to prevent discharge before the segment is enabled a series coupled device is added to each CAM cell, thereby increasing chip area and slowing down the entire operation.

In an article entitled "Use of Selective Precharge for Low Power on the Match Lines of Content Addressable Memories"by Zukowski et al. IEEE 19971 there is described a method whereby a small segment of an overall match line is precharged and used to perform a partial comparison first and only if a match occurs in that first small segment is the remaining segment of the match line precharged and eventually searched. The article also suggests that theoretically the selective precharge technique could be extended to cover more than one stage, but the additional overhead, extra clock phases and additional buffering would not provide any large additional gains over the single stage selective precharge proposed therein. This approach does not consider the possibility of having multiple match lien segments working sequentially but independently of clock cycles, providing a sufficient fast process technology is available to implement the necessary circuitry. Furthermore, the approach discussed by Zukowski et al. still relies on a precharge to a logic 'H' state which can draw large amounts of current as previously explained.

Hence current CAM devices are not suitable for low power applications where conservation of battery power is critical. Thus there is still a need for CAM which is capable of consuming less power during search operations than conventional search techniques.

SUMMARY OF THE INVENTION

It is an object of the present invention to obviate or mitigate at least one disadvantage of previous CAM arrays. In particular, it is an object of the present invention to provide a content addressable memory architecture and method of operation that has reduced power consumption and that operates at high speed.

In a first aspect, the present invention provides a content addressable memory array. The content addressable memory array includes a matchline divided into a plurality of segments, where each of the plurality of segments is simultaneously precharged to a precharge voltage level in a precharge phase. The content addressable memory array also includes a matchline sense amplifier associated with each of the segments for sensing current from its associated segment in a sensing phase, where one matchline sense amplifier enables another matchline sense amplifier when a match condition is detected by the one matchline sense amplifier.

In an embodiment of the present aspect, timing circuits control precharge and sensing operations of the matchline sense amplifiers, and the timing circuits include reference matchlines in another embodiment of the present aspect, the precharge voltage level corresponds to a miss condition that corresponds to a voltage level of ground.

In yet another embodiment of the present aspect, the matchline includes a first and a second matchline segment and the matchline sense amplifier associated with the first matchline segment enables the matchline sense amplifier associated with the second matchline segment. In an aspect of the present embodiment, the first matchline segment is coupled to fewer content addressable memory cells than the second matchline segment.

In another embodiment of the present aspect, the output of each matchline sense amplifier is stored in a latch circuit.

In a second aspect, the present invention provides a method of searching a content addressable memory having a plurality of rows of CAM cells, where each row has first and second matchline segments. The method includes the steps of precharging the first and second match line segments to a potential level corresponding to a miss condition during a precharge phase, establishing a biasing potential on the first matchline segment in each row of CAM cells during a sensing phase, sensing current in the first matchline segment during the sensing phase, and selectively enabling sensing of current in the second matchline segment in each row of CAM cells if the sensed current in the first matchline segment corresponds to a match condition between the search data and the stored data.

In an embodiment of the present aspect, the step of selectively enabling sensing includes converting the sensed current into a sense node output voltage. In yet another embodiment of the present aspect, the step of selectively enabling sensing includes latching the sense node output voltage for pipelined sensing of current in the first and the second matchline segments.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described by way of example only, with reference to the attached Figures, wherein.

DETAILED DESCRIPTION

A low power CAM architecture is disclosed. Matchlines of the CAM array are segmented into two search portions: a pre-search portion and a main search portion. After issuing a search command, a first search operation is conducted on the pre-search portion of the matchline, i.e. a pre-search is conducted. If the result of the pre-search is a match, then a second search is subsequently conducted on the main search portion of the matchline, i.e. a main search is subsequently conducted. If the result of pre-search is a mismatch, then the main search is disabled and no main search is conducted, and as a result, there is no power dissipation on the main search portion of the matchlines. Pre-search and main search operations can be pipelined to maintain high throughput with minimum latency. Power consumption is further reduced by using a matchline sense circuit for detecting a current on the pre-search and main search portions of the matchline. Matchlines are decoupled from the sense circuit sense node in order to achieve higher sensing speed and improved sense margins, and dummy matchlines are used to generate timed control signals for latching the output of the matchline sense circuits. All matchline segments are initially precharged to a miss condition, and are then set to a bias voltage prior to sensing. Although only two matchline segments are described, it will be appreciated by someone skilled in the art that multiple segments could be formed.

Figure 4:
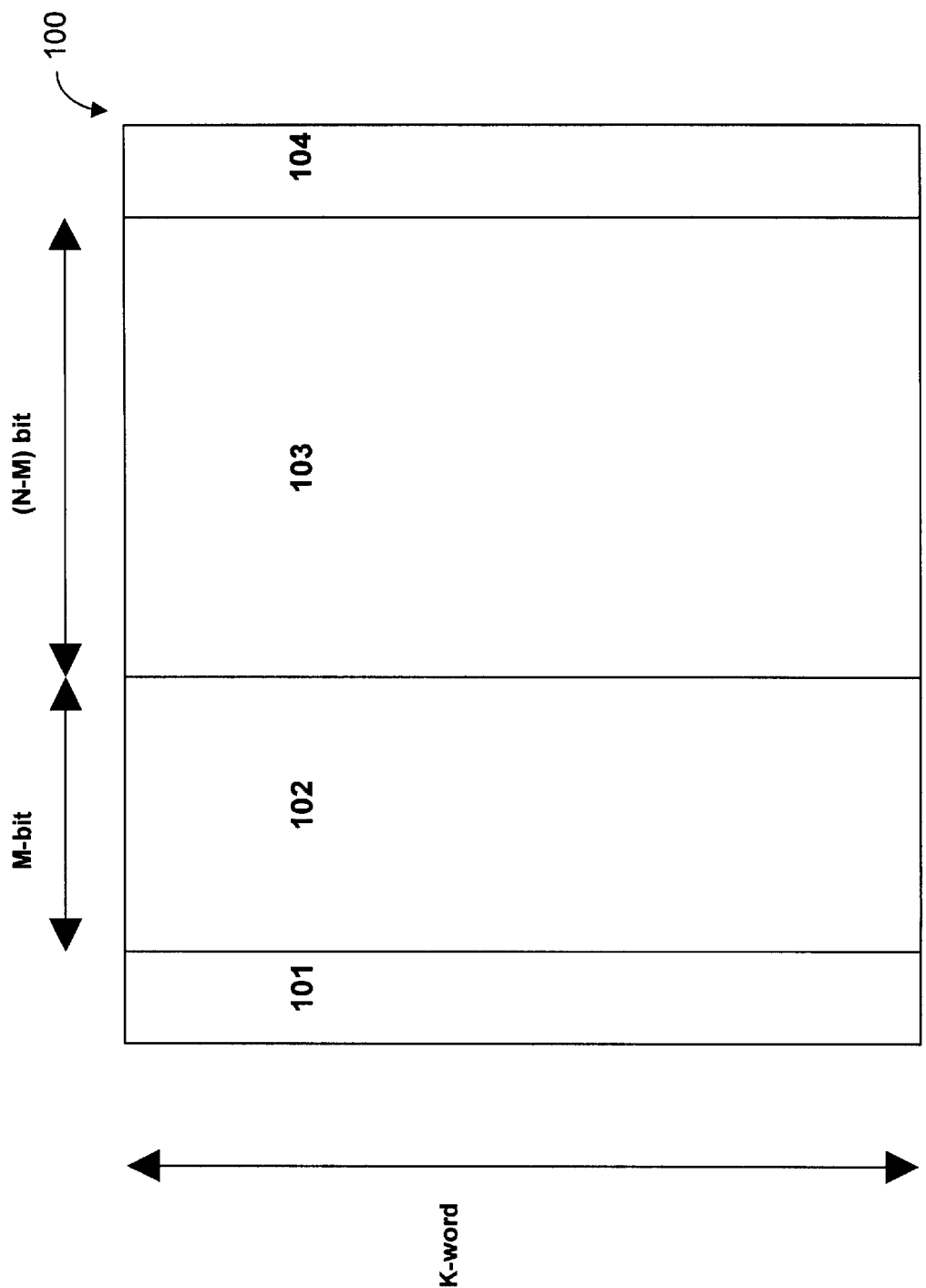
FIG. 4 is a simplified block diagram of a segmented matchline CAM array according to an embodiment of the present invention.

FIG. 4 shows the general low power CAM cell array architecture according to an embodiment of the present invention. It will be noted by those skilled in the art that FIG. 4 represents a conceptual illustration of a CAM cell array, since the physical implementation would involve dividing the overall CAM into a plurality of quadrants and sub-blocks. The conceptual CAM cell array 100 of FIG. 4 includes N columns and K rows. Each word (i.e. row) includes N-bits. Therefore the memory capacity of N-bit x K-word. According to one embodiment of the invention, the CAM cell array is divided into two parts; a pre-search cell array 102 and a main-search cell array 103. Array 100 includes a pre-search matchline sense amplifier block 101 for sensing the pre-search matchlines of the pre-search cell array 102, and a main-search matchline sense amplifier block 104 for sensing the main matchlines in the main-search cell array 103. The pre-search matchlines of the pre-search cell array 102 are physically distinct from the main matchlines of the main search cell array 103. Although not shown in FIG. 4, the CAM array also includes dummy rows and logic circuits for controlling the matchline sense amplifiers. The dummy rows and logic circuits will be shown and discussed later with reference to FIG. 7.

Figure 5:
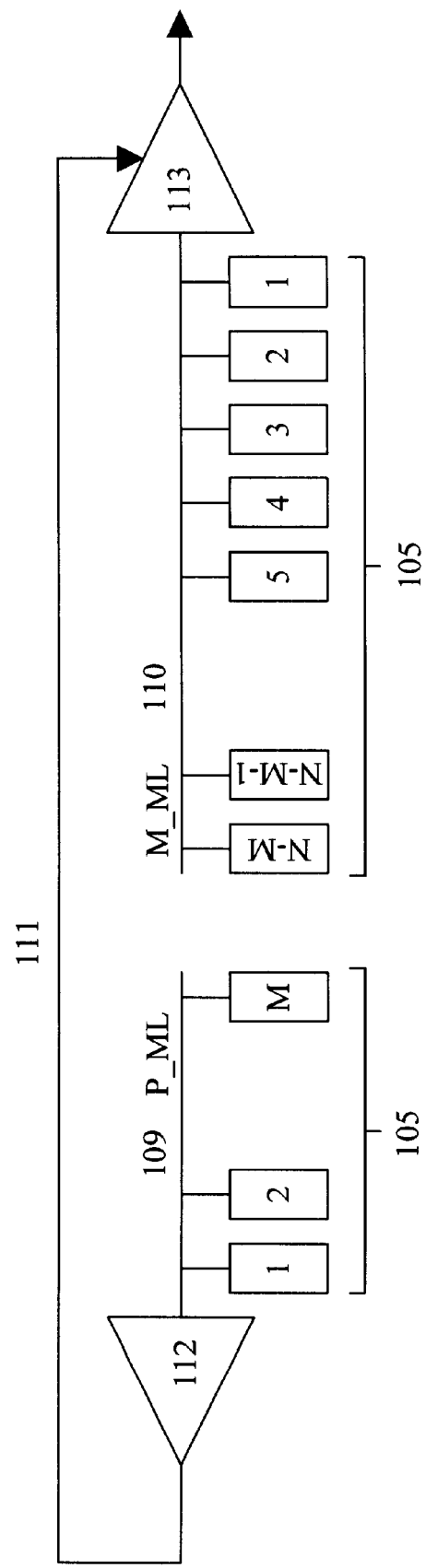
FIG. 5 is a schematic of a segmented matchline and associated sense amplifiers according to an embodiment of the present invention.

FIG. 5 shows a simplified schematic of a segmented row and its associated segmented matchline for the CAM array of FIG. 4. M number of CAM cells 105 are connected to a pre-search match-line 109 labelled P ML and the pre-search match-line is sensed by pre-search matchline sense amplifier 112. N M number of CAM cells 105 are connected to a main-search match-line 110 labelled M ML, and the main-search search match-line is sensed by main-search sense amp 113. The output 111 of pre-search sense amp 112 either enables or disables main-search sense amp 113 depending on whether a match or a mismatch occurred in the pre-search segment CAM cells 105 can be any type of CAM cell such as SRAM, DRAM, or ternary SRAM and DRAM CAM cells. Those of skill in the art will understand that the matchline row of FIG. 5 has been simplified, and that searchlines, wordlines and power supplies are coupled to the CAM cells 105.

Figure 6:
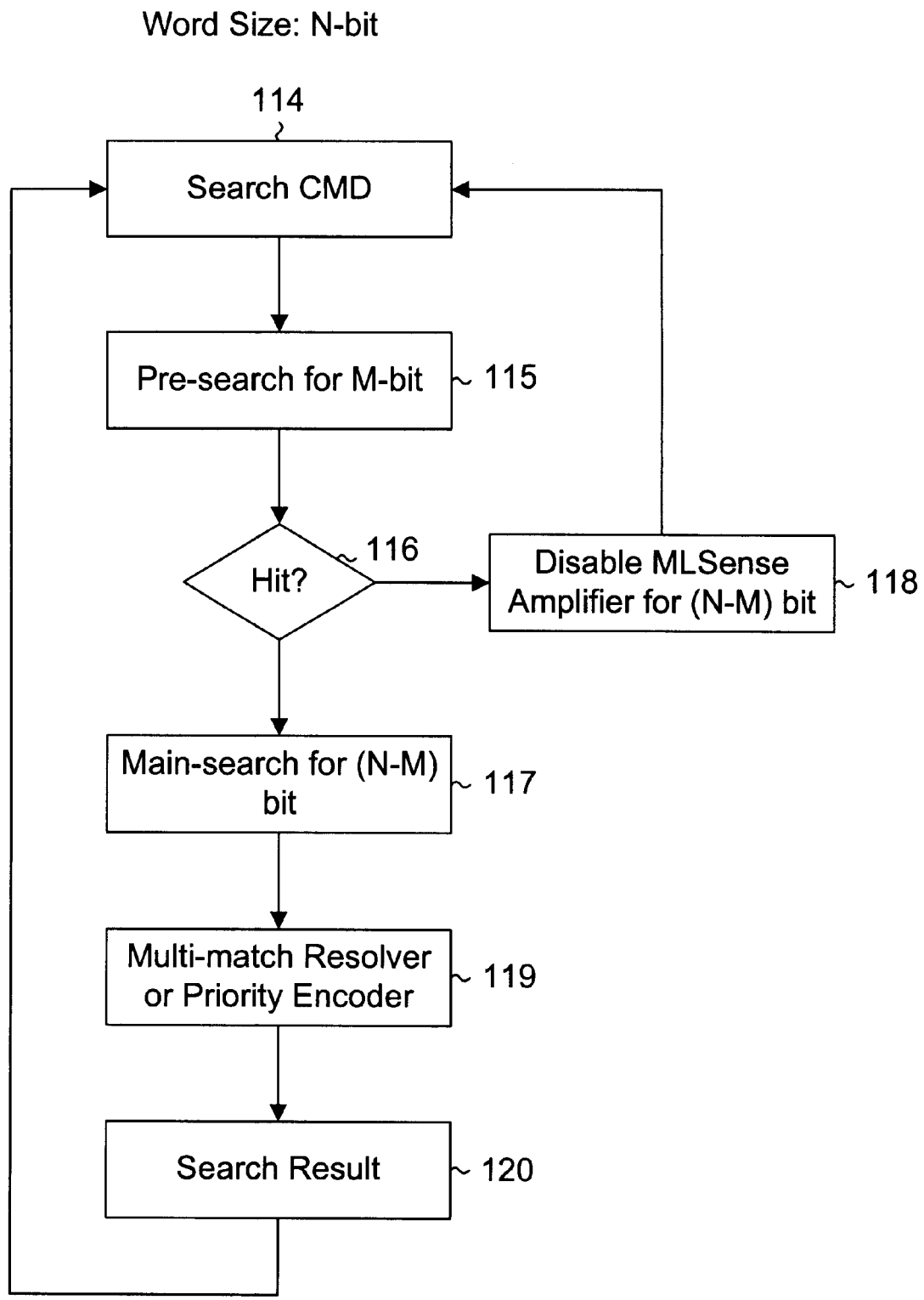
FIG. 6 is a flow chart illustrating a method of performing a search in the segmented matchline CAM array embodiment of FIGS. 4 and 5.

The flow chart of FIG. 6 illustrates the operation of each segmented matchline row according to an embodiment of the present invention. At step 114, an external search command is received by the CAM device. At step 115, the CAM then internally mutates a pre-search operation on the M-bit segment of the matchlines. At step 116 the result of the pre-search is evaluated, and if a hit is detected in the pre-search portion, then the process proceeds to step 117. Otherwise if a mismatch is detected in the pre-search portion, then processing continues with step 118. Step 118 results in the sense amplifier for the main search portion being disabled and placing the device in a state to receive a new search command. Step 117 continues with a main search operation of the main search segment. Step 119 provides main search matchline sensing results to a multiple-match resolve and priority encoder. Step 120 provides highest priority match result output from priority encoder as an output from the CAM device and returns the device to a state where it is ready to receive a new search command. It should be noted that this process has been described without any pipelining function implemented. By using pipelining, a new pre-search operation for example could be started at step 114 while a main search operation is completing its steps in steps 117–120. This pipelining approach is discussed in more detail with reference to FIG. 10, and would allow more searches to be performed at a higher system clock speed. Thus by segmenting the matchlines, power is saved because any matchline exhibiting a mismatch in it pre-search portion will not charge and discharge its main search portion since the matchline as a whole will result in a mismatch.

Both FIGS. 4 and 5 illustrate the general layout of the matchline sense amplifiers with respect to their matchlines according to one embodiment of the present invention. In alternate embodiments, the main matchline sense amplifiers 113 can be placed on the opposite end of main matchline 110 to reduce the length of the line carrying the output 111. In yet another alternate embodiment, both the pre-search matchline sense amplifier 112 and the main search matchline sense amplifier 113 can be placed adjacent to each other to minimize the length of the line carrying output 111.

Therefore, the previously described segmented matchline architecture can reduce power consumption when compared to prior art CAM devices that do not have segmented matchlines. The embodiments of the present invention shown thus far can be applied to CAM devices employing any type of sensing scheme. More specifically, conventional CAM devices employ sensing schemes where the matchlines are precharged to a hit condition, such as high potential levels such as VDD for example. Therefore, the segmented matchline embodiments of the present invention can help conserve power by inhibiting precharge of the main search matchline and activation of the main matchline sense amplifiers, resulting in activation of only a subset of the array of the main search.

According to another embodiment of the present invention, optimum power savings can be achieved by employing a sensing scheme where the matchlines are precharged to a miss (mismatch) condition. Generally, a precharge-to-miss sensing scheme involves precharging matchlines to the miss condition (can be either ground or logic high, depending on the type of compare transistors used in the CAM cell), asserting the search data, and sensing any change on the matchline with a matchline sense amplifier. In the case of a match condition, there are not current paths to ground, and the potential level of the matchline rises quickly to a predetermined threshold which is used to indicate the match condition. In the case of a miss, there will be at least one current path to ground and the potential level of the matchline rises more slowly to the predetermined threshold level. Accordingly, the matchline potential level rises at a rate depending on the number of resulting paths to ground. By precharging the matchline to ground, the voltage swing of the matchline is limited to a potential level between ground and the predetermined threshold level. This predetermined threshold level can be the switching point of an inverter for example, which is less then VDD. By combining this precharge-to-miss sensing scheme with the a segmented matchline structure described in FIG. 5, further power can be saved because a matchline segment precharged to the miss state will remain at the miss state as long as its corresponding proceeding matchline segment encounters a miss. Therefore in one embodiment of the present invention, each row of matchlines in a CAM array are segmented into pre-search matchlines and main search matchlines as shown in FIGS. 4 and 5, and a sensing scheme where the pre-search and main search matchlines are precharged to a miss state to reduce power consumption is used.

Figure 1:
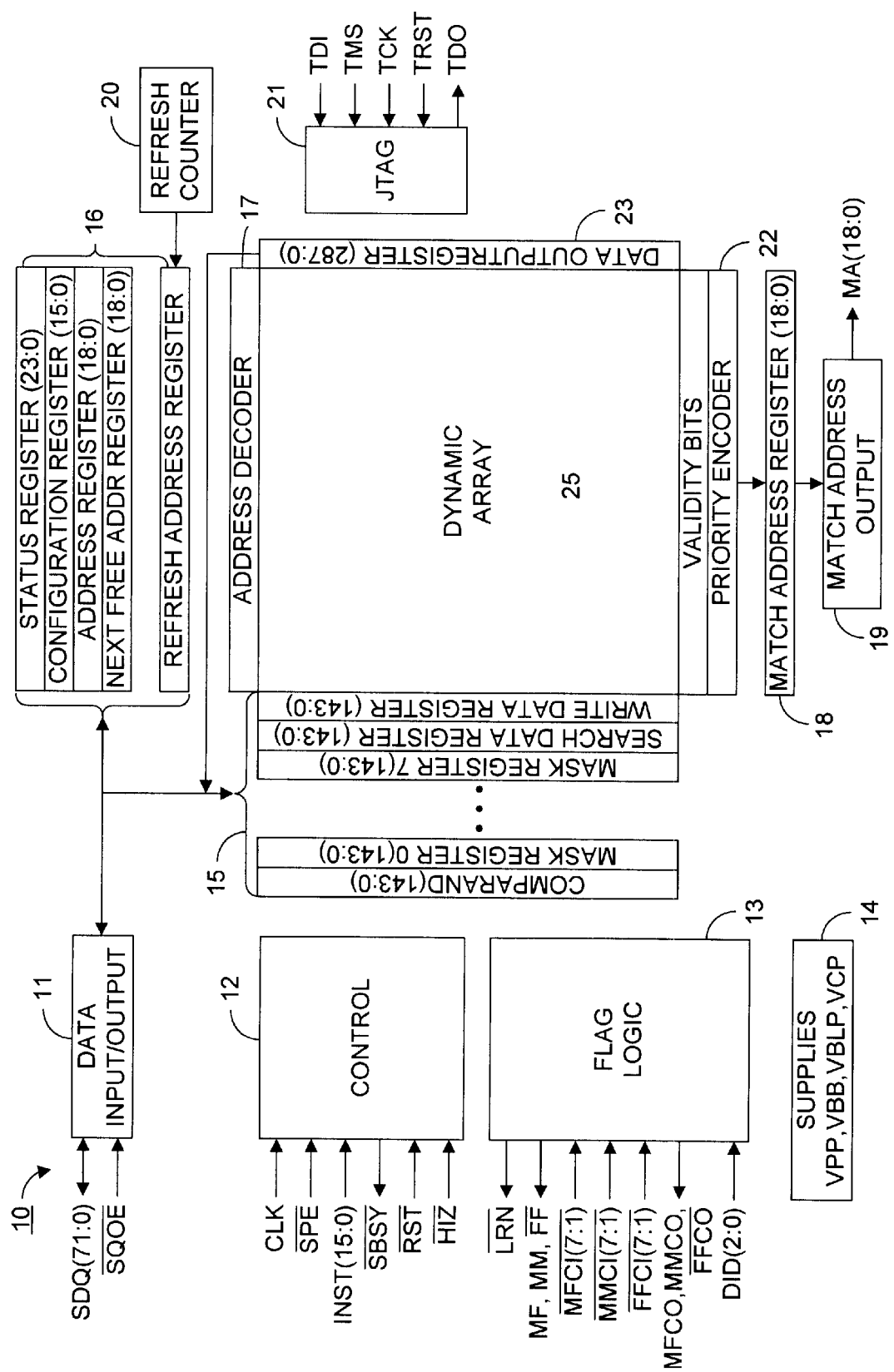
FIG. 1 is a block diagram of a conventional CAM device.
Figure 2:
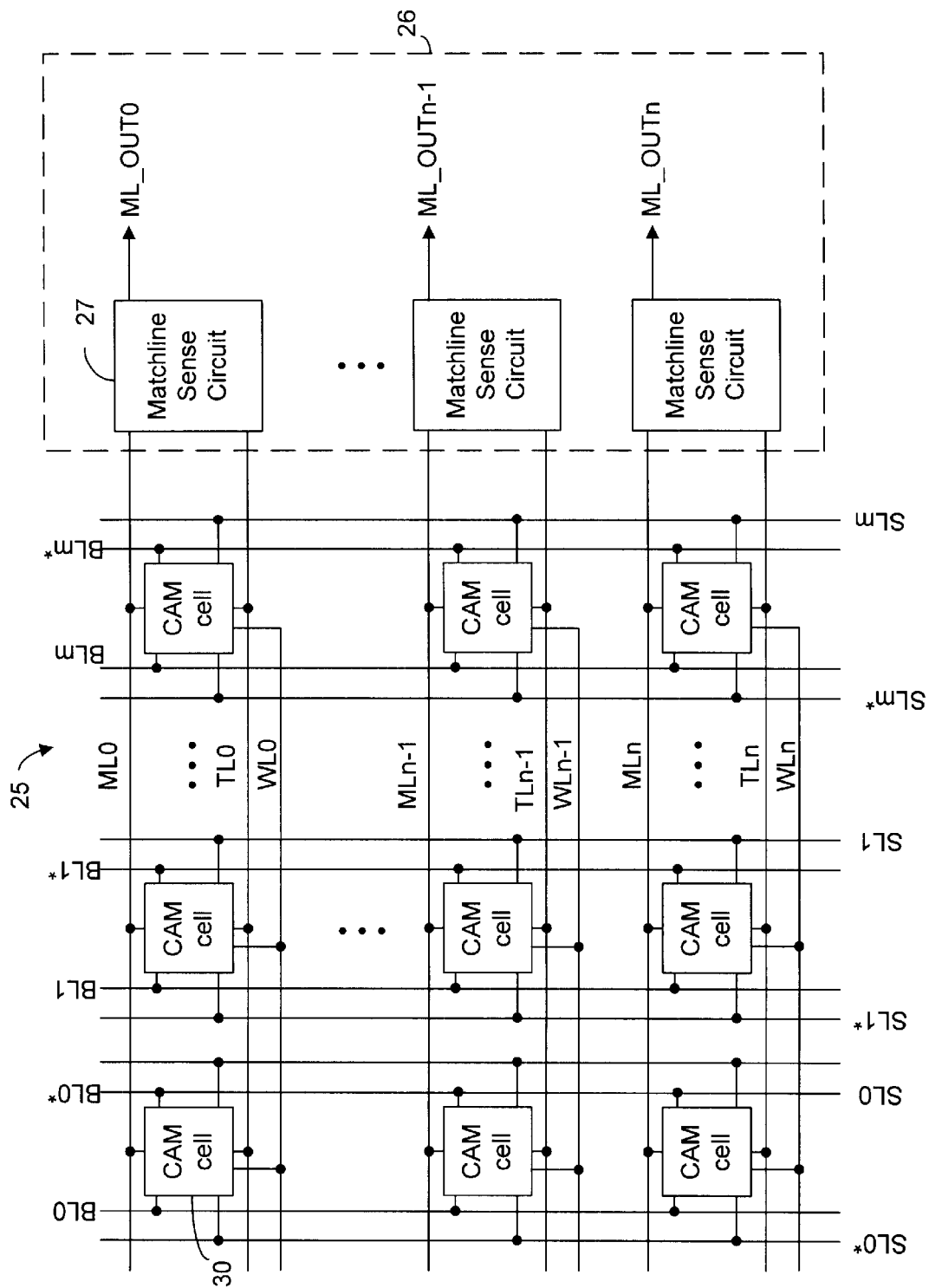
FIG. 2 is a block diagram of a portion of the CAM array of FIG. 1.
Figure 7:
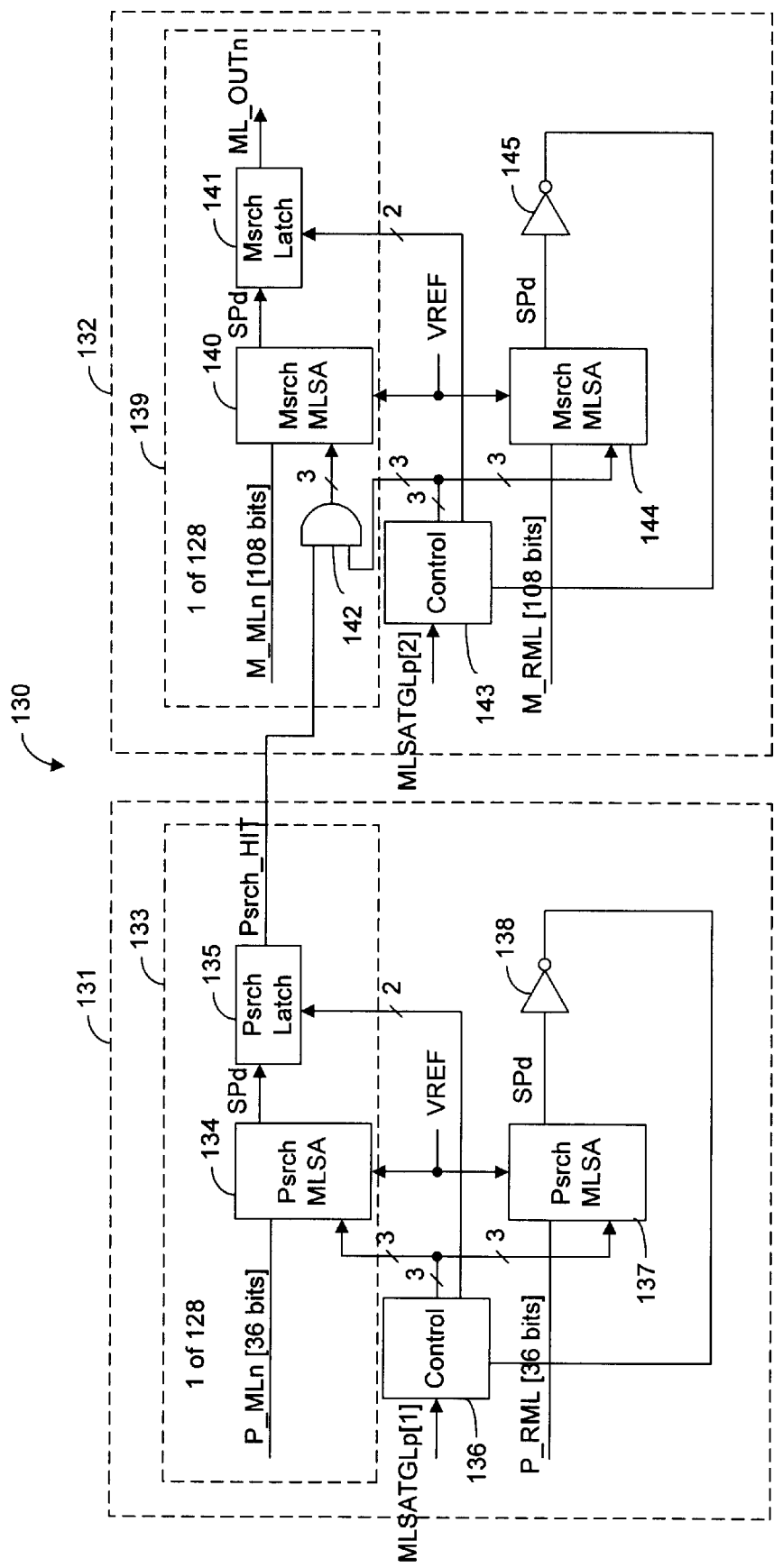
FIG. 7 is a block diagram illustrating an embodiment of the low power CAM architecture according to an embodiment of the present invention.

FIG. 7 illustrates an embodiment of the low power CAM architecture according to the present invention. The low power CAM architecture uses segmented matchlines and a sensing scheme where the matchlines are precharged to a miss state. Furthermore, the sensing scheme uses reference matchlines to provide self-timed generation of control signals for controlling the matchline sense amplifiers and latch circuits coupled to each matchline. The CAM array 130 of FIG. 7 can replace the array 25 show in the CAM device of FIG. 1, with corresponding modifications to the peripheral circuits, such as the search line drivers.

CAM array 130 of FIG. 7 includes a pre-search array 131 and a main search array 132. Although no memory array is shown in FIG. 7, it will be understood by those skilled in the art that the term array used in this context refers to both the memory array as well as its associated control circuitry. The pre-search array 131 includes a plurality of pre-search matchlines and associated circuitry 133, and a reference pre-search matchline circuit. In this particular example of the present embodiment, 1 of 128 pre-search matchline rows 133 and the reference matchline circuit are shown. Each pre-search matchline row 133 includes a pre-search matchline P MLn, a pre-search matchline sense amplifier 134 and a pre-search latch 135. In this particular example of the present embodiment, there are 36 ternary CAM cells (not shown) connected to the pre-search matchline P MLn. The pre-search matchline sense amplifier 134 senses the potential level of P MLn and provides a local output signal SPd corresponding to a hit or miss condition to the pre-search latch 135. Pre-search latch 135 holds the state of the local output signal SPd and generates signal Psrch HIT. Both the pre-search MLSA 134 and the presearch latch 135 receive timed control signals from the reference pre-search matchline circuit via a timing control circuit 136, and pre-search MLSA 134 receives a reference voltage VREF generated by a reference voltage generator (not shown in FIG. 7).

The reference pre-search matchline circuit includes a timing control circuit 136, a reference pre-search matchline P RML, a pre-search matchline sense amplifier MLSA 137 and an inverter 138. In this particular example of the present embodiment, there is one reference pre-search matchline circuit for the pre-search array 131. The reference pre-search matchline P RML is identically configured to the pre-search matchline P MLn to match the parasitic resistance and capacitance of the pre-search matchline P MLn, except that all the search and compare transistors of the CAM cells are permanently turned off with the exception of one pair of search and compare transistors that are permanently turned on. The reference pre-search matchline is thus hardwired to simulate a single miss condition. Pre-search matchline sense amplifier MLSA 137 is identical to pre-search matchline sense amplifier MLSA 134, for sensing the potential level of P RML. Pre-search MLSA 137 also receives VREF. Instead of having a latch circuit at the output of the pre-search matchline sense amplifier 137 as in the case with the output of the pre-search matchline sense amplifier MLSA 134, an inverter 138 receives the reference pre-search output SPd of pre-search MLSA 137. Timing control circuit 136 receives as a feedback signal the output of inverter 138 and a matchline sense amplifier toggle signal MLSATGLp[1] and generates three signals for use by all pre-search MLSA's 134 and 137, and two signals for use by all pre-search latches 135. MLSATGLp[1] initiates sensing in the pre-search array 131. Although not shown, timing control circuit 136 also receives a clock signal for synchronizing the search operation with a system clock. The three signals on the bus marked "3" of pre-search array 131 for use by all pre-search MLSA's 134 and 137 are pre-search matchline sense enable signal PMLSAENp for NMOS devices, pre-search matchline sense enable signal PMLSAENn for PMOS devices, and PMLSAPRp for the precharge devices. The matchline sense amplifier circuit of MLSA's 134 and 137 will be described in more detail with reference to FIG. 8. The two signals on the bus marked "2" of pre-search array 131 for use by all pre-search latches 135 and PLTCHn and PLTCHp.

The general operation of the sensing scheme for the pre-search array 131 is now described for one search and compare cycle (a more detailed description of the operation of the matchline sense amplifier circuit will be provided later in the Description). All the pre-search matchlines P MLn and P RML are precharged to the miss state, which in this embodiment is the ground voltage during a precharge phase. After search data is asserted onto the searchlines (not shown), the matchline sense amplifier toggle signal MLSATGLp[1] is activated to initiate the sensing phase via signals PMLSAENp, PMLSAENn and PMLSAPRp. In the sensing phase, as will be described in more detail later with reference to the specific operation of a preferred embodiment of the matchline sense amplifier circuit, SPd output of pre-search MLSA 137 is eventually driven from a high potential level to a potential level low enough to cause inverter 138 to switch and feedback a high logic level output to timing control circuit 136. Timing control circuit 136 then turns off the pre-search MLSA's 134 and 137 to save power, and activates the matchline latching signals PLTCHn and PLTCHp to enable latching of the local SPd outputs from respective pre-search MLSA's 134. Once the SPd outputs have been latched, timing control circuit 136 then has all the pre-search matchline sense amplifier circuits MLSA's 134 and 137 precharge all respective pre search matchlines to the miss state of ground in preparation for the next search and compare cycle.

The time required for pre-search MLSA 137 to drive its SPd output to a potential level to switch the state of inverter 138 is determined by the configuration of pre-search reference matchline P RML. More specifically the reference pre-search matchline row always simulates a worst case miss condition, i.e. a single bit miss. This is due to the fact that only one search and compare transistor pair is on while all the other search and compare transistors of P RML are off. When a single miss occurs in any matchline, the single search and compare transistor pair generates a very small current, about 10 $\mu$A, which requires a relatively long time for the associated matchline sense amplifier to detect and subsequently drive its SPd output to a low potential level. If the pre-search MLSA's 134 and the pre-search MLSA 137 are simultaneously turned on after search data is asserted on the search lines, by the time the reference pre-search MLSA 137 has changed its SPd potential level, any MLSA 134 connected to a P MLn with a match will already be in a state to drive its respective SPd output to a logic level indicative of a hit. This is because the rate at which the potential level of a match condition matchline rises is faster than the rate at which the potential level of a miss matchline rises. In this manner, by using the reference pre-search matchline to time the deactivation of all matchline sense amplifiers, the system ensures that the proper matchline search result data is being latched by the matchline latches.

The components of the main search array 132 of CAM array 130 will now be described in further detail. The main search array 132 includes a plurality of main search matchlines and associated circuitry 139, and a reference main search matchline circuit. In this particular example of the present embodiment, each of the 128 main search matchline rows 139 corresponds to each of the 128 pre search matchline rows 133. Each main search matchline row 139 includes a main search matchline M MLn, a main search matchline sense amplifier 140 a main search latch 141, and an AND gate 142. In this particular example of the present embodiment, there are 108 ternary CAM cells (not shown) connected to the main search matchline M MLn. The main search matchline sense amplifier 140 senses the potential level of M MLn and provides a local output signal SPd corresponding to a hit or miss condition to the main sense latch 141. Main search latch 141 holds the state of the local output signal SPd and generates signal ML OUTn. As seen in FIG. 7, the components of the main search array 132 are configured identically to the components of the pre-search array 131, except that each main search matchline and associated circuitry 139 includes an AND gate 142. While main search latch 141 and reference main search MLSA 144 receive the control signals from the timing control circuit 143, main search MLSA's 144 do not directly receive the signals from timing control circuit 143. AND gate 142 receives the three signals from turning control circuit 143, and combines them with the result of the pre-search designated by signal Psrch HIT from the pre-search latch 135 from pre-search array 133. Those of skill in the art will understand that AND gate 142 represents three AND gates each of which receive one of the three control signals from control block 143 and the Psrch HIT signal, and each AND gate 142 generates a control signal which is provided to the main search sense amplifier 140. The AND gates 142 will enable passage of the three respective control signals when Psrch HIT indicates that a hit has been detected in the pre-search matchline portion, i.e., is at the high logic level. In other words, a main search sense amplifier MLSA 140 will be prevented from receiving the three control signals if signal Psrch HIT is at the low logic level, indicative of a miss condition. Hence a main search MLSA 140 is inhibited from sensing changes in the main matchlines of main search array 132 if its corresponding pre-search matchline row 133 reports a miss condition. It will be understood by those skilled in the art that although AND gate 142 has been described as combining each control signal from the control block 143 with the Psrch HIT signal, it is possible to combine only one or two of the control signals with the Psrch HIT signal. For example, in one embodiment of the invention, only one of the three control signals provided by the control block 143 is combined with the Psrch HIT signal to generate a control signal that is provided to the Msrch MLSA while the other two control signals generated by control block 143 are provided directly to the Msrch MLSA. Such an embodiment will be described in more detail with reference to FIG. 8.

The reference main search matchline circuit includes a timing control circuit 143, a reference main search matchline M RML, a main search MLSA 144 and an inverter 145. In this particular example of the present embodiment, there is one reference main search matchline circuit for the main search array 132. The reference main search matchline M RML is identically configured to the main search matchline M MLn to match the parasitic resistance and capacitance of the main search matchline M MLn, except that all the search and compare transistors of the CAM cells are permanently timed off with the exception of one pair of search and compare transistors that are permanently turned on. The reference main search matchline is thus hardwired to simulate a single miss condition. Main search MLSA 144 is identical to main search MLSA 140, for sensing the potential level of M RML. Main search MLSA 144 also receives reference voltage VREF. An inverter 145 receives the SPd output of main search MLSA 144. Timing control circuit 143 receives the output of inverter 145 and a matchline toggle signal MLSATGLp[2] and generates three control signals for controlling all main search amplifiers MLSA's 140 and 114, and two control signals for controlling all main search latches 141. Although not shown, timing control circuit 143 also receives a clock signal for synchronizing the search operation with a system clock, thereby allowing for pipelining of the pre search and main search operations. The three control signals on the bus marked "3" of main search array 132 for controlling all main search MLSA's 140 and 144 are MLSAENp, MLSAENn and MLSAPRp. The two control signals on the bus marked "2" of main search array 132 for controlling all main search latches 141 are LTCHn and LTCHp.

The general operation of the circuits of main search array 132 is the same as previously described for pre-search array 131, and therefore the general operation of the circuits of main search array 132 will not be repeated. Of note however, is that toggle signal MLSATGLp[2] is activated after MLSATGLp[1], typically in a clock cycle following the cycle in which MLSATGLp[1] is activated. It should also be noted that signals MLSAENp, MLSAENn, MLSAPRp, LTCHn and LTCHp are equivalent in function to signals PMLSAENp, PMLSAENn, PMLSAPRp, PLTCHn and PLTCHp respectively for their respective arrays.

Figure 8:
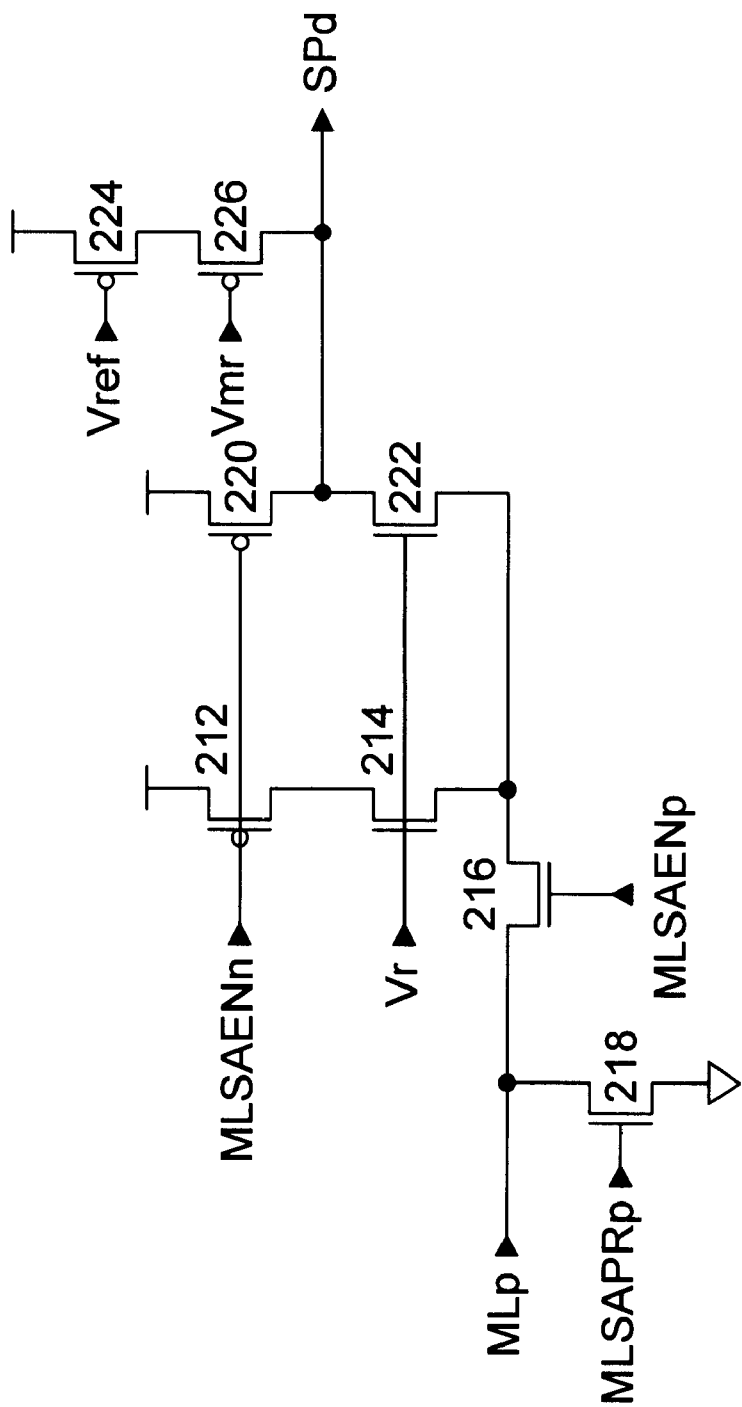
FIG. 8 is a circuit schematic of the matchline sense amplifiers of FIG. 7.

FIG. 8 shows a circuit schematic of a matchline sense amplifier circuit according to another embodiment of the present invention. This matchline sense amplifier circuit can be used as the MLSA circuits 134, 137, 140 and 144 in FIG. 7 in a preferred embodiment of the low power CAM array architecture invention.

The matchline sense amplifier circuit of FIG. 8 includes a current source, a biasing circuit and a voltage limiting circuit. The current source includes p-channel transistors 224 and 226 serially connected between the voltage supply VDD and a sense output node SPd. The gate terminal of p-channel transistor 226 is connected to a first reference voltage Vref and the gate terminal of p-channel transistor 226 is connected to a second reference voltage Vmr. The biasing circuit includes p channel transistors 212, 220 and n-channel transistors 214, 216 and 218. P-channel transistor 212 and n-channel transistor 214 are serially connected between the supply voltage VDD and the drain terminal of n-channel transistor 216. P-channel transistor 220 and n-channel transistor 222 are serially connected between the supply voltage VDD and the drain terminal of n-channel transistor 216, where the shared source/drain terminal of transistors 220 and 222 is connected to sense output node SPd. The gate terminals of p-channel transistors 212 and 220 are connected to matchline sense amplifier enable signal MLSAENn, and the gate terminals of n-channel transistors 214 and 222 are connected to limiting voltage Vr. N-channel transistors 216 and 218 are serially connected between the source terminals of n-channel transistors 214 and 222 and ground, where the shared source/drain terminal of transistors 216 and 218 is connected to an associated matchline MLp. It should be noted that MLp is equivalent to any one of P MLn, P RML, M MLn and M RML, because they are all matchlines that are to be sensed by the matchline sense amplifier circuit. The gate terminals of transistors 216 and 218 are connected to matchline sense enable signal MLSAENp and and matchline sense precharge signal MLSAPRp respectively. The voltage limiting circuit includes n-channel transistor 222 having the previously described configuration. Main search array control signals, MLSAENn, MLSAENp and MLSAPRp are equivalent to pre-search array control signals PMLSAENn, PMLSAENp and PMLSAPRp respectively that were previously discussed with reference to FIG. 7. Voltages Vref, Vr and Vmr are generated by other circuits in the CAM device, and are shown in FIG. 7 as a single line labelled VREF to simplify the block diagram.

A description of the general function of the matchline sense circuit of FIG. 8 follows. In general, as a result of a search and compare operation, the matchline MLp carries a voltage signal and an associated current, that is indicative of a match or mis-match condition after search data is applied onto the search lines. The associated matchline current will flow when at least one pair of search and compare transistors are turned on to coupled MLp to ground. In order to sense a match or mis-match condition on a matchline according to the invention, a positive biasing point potential on matchline MLp is first established before search data is applied onto the search lines in order for the matchline current sense amplifier to detect any change in the matchline current as a result of the search operations.

During a precharge phase, matchlines are precharged in a precharge voltage, such as ground potential for example, when the matchline precharge signal MLSAPRp is logic high. At the same time, the matchline sense signals MLSAENp and MLSAENn are logic low and high respectively, isolating the matchline MLp from the sense node SPd.

During the sensing phase, the precharging of matchlines ceases with MLSAPRp being pulled in logic low level, and current is provided to matchline MLp with MLSAENn being pulled to low logic level and MLSAENp being pulled to a high logical level. Vr is at a predetermined potential level, typically about 0.5 volts. Under these conditions transistors 212, 214 and 216 are turned on while transistor 218 is turned off and biasing potentials are established on the matchline and the sense node SPd. It should be noted that transistors 214 and 222 receive limiting voltage Vr, which can be about 0.5 volts, for limiting the maximum potential of the matchline MLp to about 0.5 volts. Subsequently, MLSAENn is driven to the high logic level to turn off transistors 212 and 220. P-channel transistors 224 and 226 of the current source remain turned on to supply a small biasing current which is high enough to maintain SPd at VDD. In the present embodiment, the biasing current supplied by the current source is a fraction of the current generated when one pair of search and compare transistors is turned on. This particular feature of the present embodiment is discussed later. After search data is applied to the search lines, at least one or zero search and compare transistor pairs are turned on. If at least one pair of search and compare transistors is turned on, then a matchline current will flow from MLp to ground. This matchline current will be larger than the biasing current supplied by the current source, and pulls down the sense node SPd through transistors 222 and 216. If no search and compare transistor pairs are turned on to indicate a match condition, then the potential level of MLp remains at the precharge potential of Vr due to the presence of voltage limiting transistor 222. Correspondingly, SPd remains at VDD. A latch circuit such as the one shown in FIG. 9 does not latch the potential on SPd until complimentary latch signals LTCHp and LTCHn become active at a predetermined period of time after search data is driven onto the searchlines. After this predetermined period of time, the potential level of SPd is either above or below the flip point of tri state inverter 150, and the complementary latch signals LTCHp and LTCHn are pulsed to their active states by the control circuit of FIG. 11. Depending upon the potential of SPd relative in the tri-state inverter 150 flip point, tri-state inverter 150 will either drive a high or low logic level at its output. When the LTCHp and LTCHu pulses end, tri-state inverter 150 is turned off. Once the sensing operation has finished, signal MLSAENp is driven to the low logic potential level to turn off transistor 216 and signal MLSAPRp is driven to the high logic potential level to turn on transistor 218, thereby brining the associated matchline MLp to its precharge level once again.

It should be noted that in an alternate embodiment of the matchline sense circuit shown in FIG. 4, transistors 212 and 214 are omitted and the width of transistors 220 and 22 are adjusted to compensate for the removal of the current patch provided by transistors 212 and 214.

Figure 9:
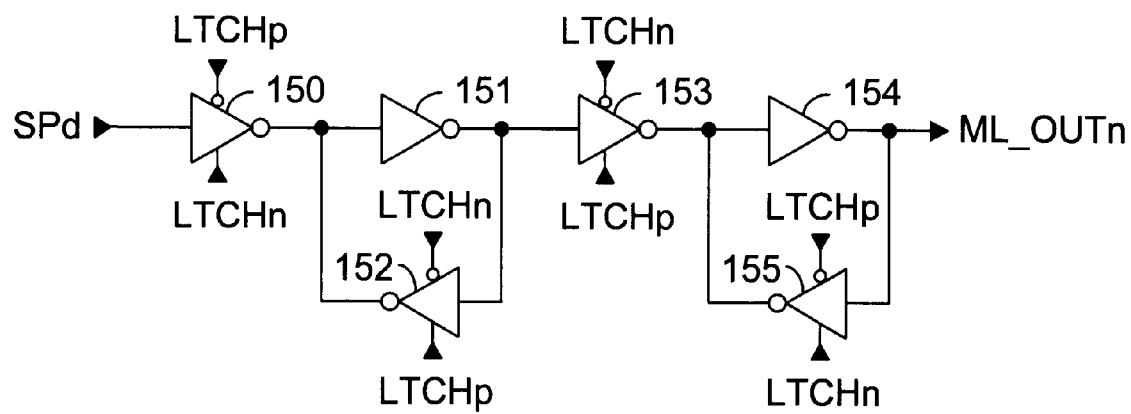
FIG. 9 is a circuit schematic of the latches of FIG. 7.

FIG. 9 shows a circuit schematic of a latch circuit that can be used as latches 135 and 141 from FIG. 7. This latch circuit is a standard flip-flop type latch circuit, and includes a pair of cross-coupled inverters. The latch circuit of FIG. 9 includes a tri-stat inverter 150 having an input coupled to the SPd output of a matchline sense amplifier circuit and an output connected to a first cross-coupled pair of inverters. The first cross-coupled pair of inverters includes inverter 151 and tri-state inverter 152. The output of inverter 151 is connected to tri-state inverter 153, whose output is then connected to a second cross-coupled pair of inverters. The second cross-coupled pair of inverters includes inverter 154 and tri-state inverter 155. If this latch circuit is used as main search latch 141, then the output of inverter 154 drives output ML OLT. If this latch circuit is used as pre-search latch 135, then the output of inverter 154 would drive output Psrch HIT. Complementary latch signals LTCHp and LTCHn are connected to the tri-state inverters is a configuration that permits the potential level of SPd to be sensed, and then shifted from the first cross-coupled pair of inverters to the second cross-coupled pair of inverters as LTCHp is toggled between the high and low logic levels. This type of latch circuit is well known in the art, and therefore its method of operation does not require further discussion.

Figure 10:
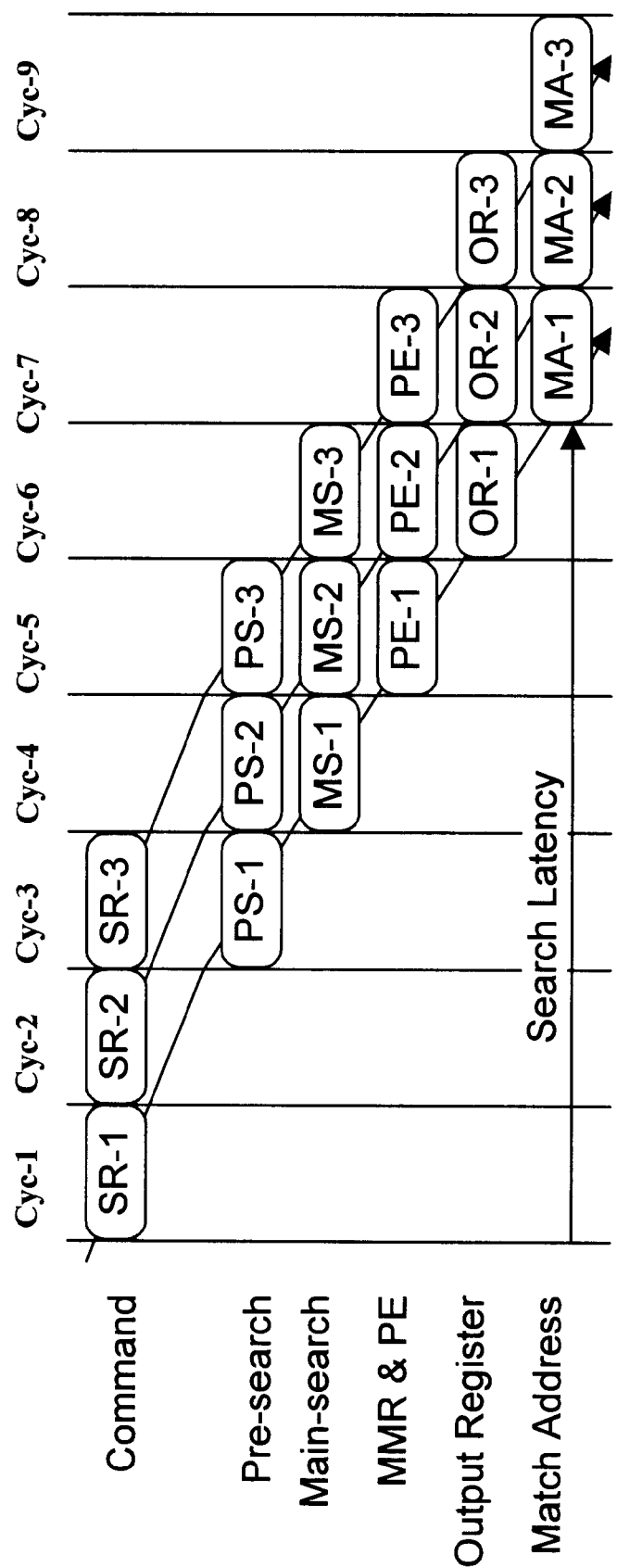
FIG. 10 is a timing diagram illustrating pipelining search operations in a CAM employing one segmented matchline embodiment of the present invention.

According to another embodiment of the present invention, pre-search and main search operations are pipelined to maintain high throughput with a cycle latency of one. FIG. 10 is a timing diagram showing pipelining operations for successive search operations. The timing diagram of FIG. 10 is discussed with reference to FIGS. 8 and 10. A pre-search begins for a first search word in cycle 3, and the result of the pre-search MLSA 134 is eventually latched and drive as signal Psrch HIT from pre-search latch 135. More specifically, the data is latched in the first cross-coupled pair of inverters of pre-search latch 135. The main search for the first search word begins for the first search word in cycle 4 if the logic level of its corresponding Psrch HIT is at the high logic level. A pre-search for a second search word also begins in cycle 4 as the main search for the first search word commences. This second pre-search operation can be executed because as complementary latch signals PLTCHp and PLTCHn are activated at the low and high logic levels respectively to sense the new SPd data from the second search word, tri-state inverter 153 of the latch circuit of FIG. 9 turns off. Furthermore, the previous SPd data is latched in the second cross-coupled pair of inverters to maintain the previous logic level of Psrch HIT for the main search of the first search word. In cycle 5, the main search is conducted for the second search word and a pre-search for a third search begins. The main search for the third search word begins in cycle 6, and there is no further pre-search to be conducted. Therefore, because of the pipelining scheme described above, there is no requirement for an additional cycle between every search and compare operation for the pre-search operation. Hence overall CAM operating speed can be increased relative to a structure not having matchline segmentation since pre-search and main search operations are executed in parallel.

The embodiment of the matchline sense amplifier shown in FIG. 8 can be used in both non-segmented as well as segmented matchline architecture to save power.

Figure 11:
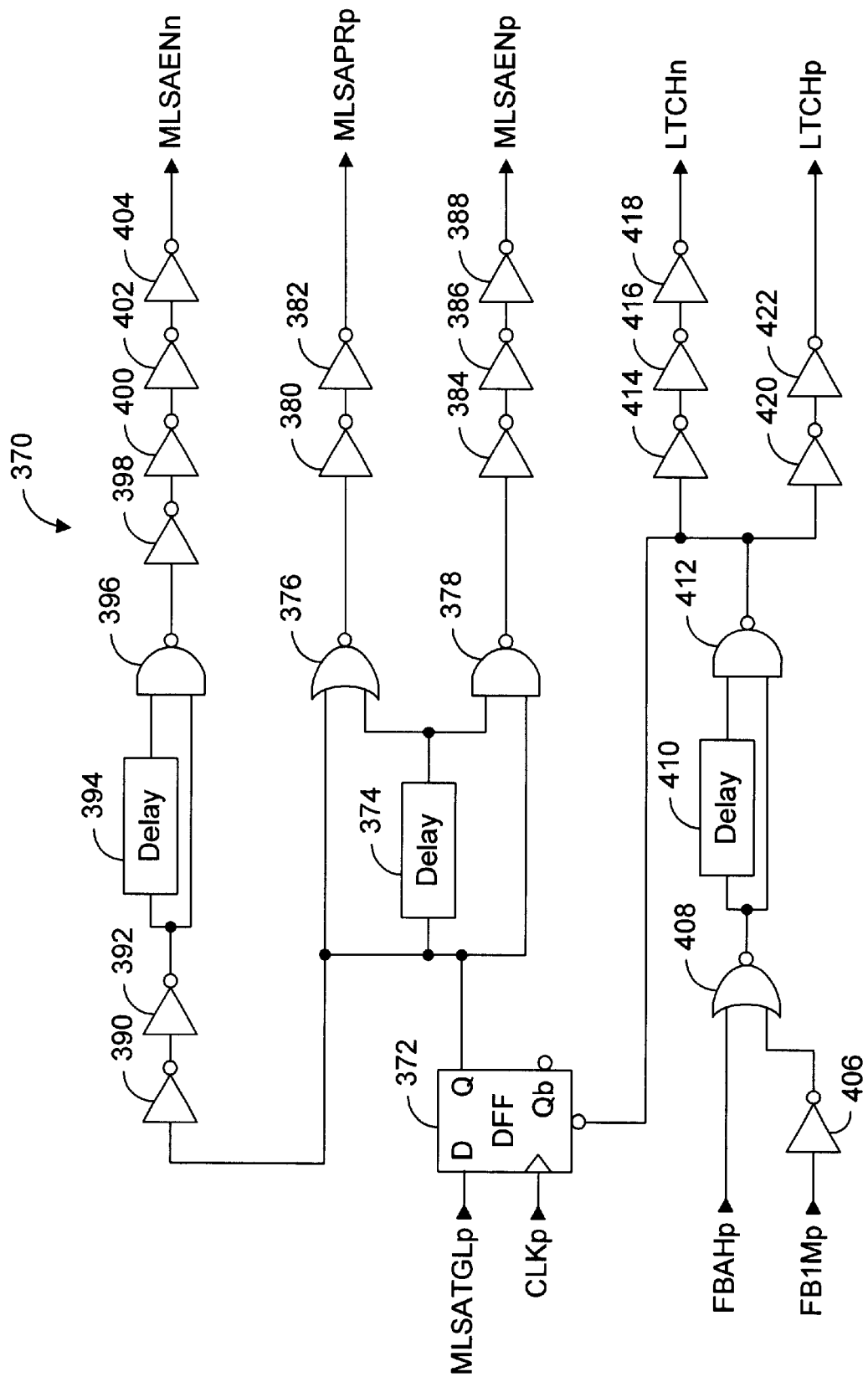
FIG. 11 is a circuit schematic of a control block for generating signals controlling the matchline sense amplifier circuit of FIG. 8.

FIG. 11 shows a circuit schematic of a control block that generates the signals for controlling the sense amplifier of FIG. 8 with proper timing. A flip-flop circuit 372 receives matchline amplifier toggle signal MLSATGLp at its D input and clock signal CLKp at its clock input. The Q output of flip-flop 372 is connected to respective first inputs of NOR gate 376 and NAND gate 378 and the input of a non-inverting delay block 372. The output of delay block 374 is connected to respective second inputs of NOR gate 376 and NAND gate 378. The output of NOR gate 376 is connected to a pair of serially connected inverters, 380 and 382, for driving signal MLSAPRp. The output of NAND gate 378 is connected to three series connected inverters, 384, 386 and 388, for driving signal MLSAENp. The Q output of flip-flop 372 is also connected to a pair of serially connected inverters 390 and 392, whose output is connected to the input of inverting delay block 394 and an input of NAND gate 396. The output of inverting delay block 394 is connected to the other input of NAND gate 396. The output of NAND gate 396 is connected to four series connected inverters, 398, 400, 402 and 404, for driving signal MLSAENn. Signal FB1Mp is coupled to one input of NOR gate 408 through inverter 406. Signal FBAHp is connected to other input of NOR gate 408. The output of NOR gate 408 is connected to the input of inverting delay block 410 and one input of NAND gate 412, while the output of inverting delay block 410 is connected to the other input of NAND gate 412. The output of NAND gate 412 is connected to three serially connected inverters 414, 416 and 418 for driving signal LTCHn, and a pair of serially connected inverters 420 and 422 for driving signal LTCHp. The output of NAND gate 412 is also connected to the reset input of flip flop 372. Delay blocks 374, 394 and 410 will delay propagation of both high and low logic level signals. Inverting delay blocks 394 and 410 can include any odd number of inverting elements, such as inverters, NOR gates or NAND gates, or a combination of an odd number of inverting elements and capacitors and resistors. Non-inverting delay block 374 can include any even number of inverting elements or combination of an even number of inverting elements and capacitors and resistors. The delay provided by delay blocks 374, 394 and 410 can be programmable after fabrication through trimming, for example.

In general, operation of the control block 370 is as follows. It should be assumed that the Q output from flip-flop 372 in the initial inactive state is at the low logic level, MLSAENn, MLSAPRp and LTCHp are at the high logic level, and MLSAENp and LTCHn are at the low logic level. A high logic level MLSATGLp pulse received by flip-flop 372 initiates control signal generation. Flip-flop 372 drives its Q output to the high logic level in response to the high logic level MLSATGLp on the rising edge of clock signal CLKp. The output of NOR gate 376 is then driven to the low logic level, and MLSAPRp is subsequently driven to the low logic level by inverter 382. After the delay provided by non-inverting delay block 374, both inputs of NAND gate 378 are at the high logic level to drive its output to the low logic level. MLSAENp is subsequently driven to the high logic level by inverter 388. The high logic level Q output of flip-flop 372 also drives the input of inverter 390, causing inverter 392 to output a high logic level. The high logic level output of inverter 392 is received by inverting delay block 394 and an input of NAND gate 396. Since the output of inverting delay block 394 is currently at the high logic level, both inputs of NAND gate 396 are at the high logic level to drive MLSAENn from a high to low logic level. Eventually, the high logic level received at the input of inverting delay block 394 is inverted at its output, forcing NAND gate 396 to output a high logic level signal. Therefore, MLSAENn pulses low in response to a high logic level Q output from flip-flop 372.

The circuits described above relate to the generation of control signals MLSAENn, MLSAPRp and MLSAENp for allowing the MLSA circuit of FIG. 8 to precharge and sense its respective matchline potential level. The following description of the remaining circuits of control block 370 relate to turning off the MLSA circuit of FIG. 8. Feedback signal FBAHp remains at the low logic level during normal operations, but feedback signal FB1Mp eventually changes from an initial low logic level to a high logic level to indicate the presence of a single miss condition on its respective matchline. NOR gate 408 provides a high logic level output when both its inputs are at the low logic level. The high logic level output from NOR gate 408 is received by one input of NAND gate 412 and the input of inverting delay block 410. Since the output of inverting delay block 410 is currently at the high logic level, both inputs of NAND gate 412 are at the high logic level to drive LTCHn from a low to high logic level, and LTCIIp from a high to low logic level. Eventually, the high logic level received at the input of inverting delay block 410 is inverted at its output, forcing NAND gate 412 to output a high logic level signal. Therefore, LTCIIn pulses high and LTCHp pulses low in response to a low logic level FB1Mp signal. Additionally, the low logic level pulse from the output of NAND gate 412 resets flip-flop 372 to drive the control signals MLSAENn, MLSAPRp and MLSAENp to their initial inactive states.

The previous paragraph illustrates the behaviour of the control block 370 is response to receiving a low logic level feedback signal FM1Mp, which is set to occur at a predetermined time after search data is inserted onto the searchlines of the CAM array. This preset time, or delay, is determined by the hardwired single miss matchline block 310. The hardwired single miss matchline block 310 is discussed in further detail with reference to FIG. 12.

Figure 12:
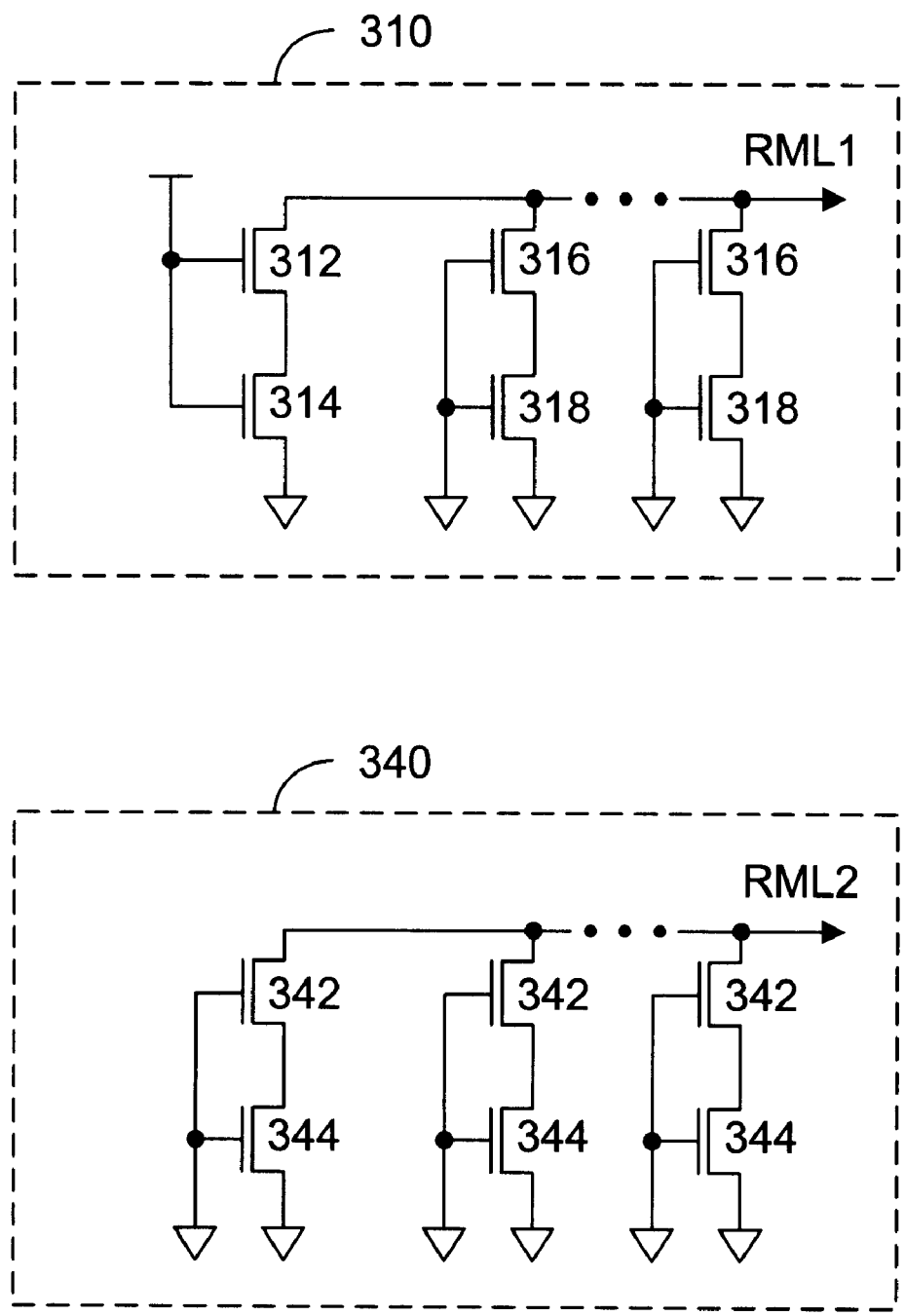
FIG. 12 is a circuit schematic of hardwired miss and hit matchline blocks.

FIG. 12 shows a schematic of hardwired single miss matchline row 310. The electrical characteristics of the single miss reference matchline row 310 are intended to be the same as a normal matchline row. Matchline row 310 includes a reference matchline RML1 having a plurality of serially connected n-channel search and compare transistors 312, 316 and 314, 318 respectively, connected between it and a tail line, or in this particular embodiment ground RML1 is identical in size to MLp in FIG. 8, and search and compare transistors 312, 316 and 314, 318 are identical to corresponding search and compare transistors that would be connected to MLp in FIG. 8. RML1 also has the same number of search and compare transistor pairs as MLp to ensure accurate matching of electrical characteristics with a matchline row. In matchline block 310, only the gates of transistors 312 and 314 are connected to VDD while the gates of all other transistors 316 and 318 are grounded. The reason for this configuration is to mimic a normal matchline having exactly one miss condition. FIG. 12 also shows a schematic of hardwired hit matchline row 340. The electrical characteristics of hit matchline row 340 are intended to be the same as a normal matchline row, and are identical to single miss matchline row 310. Search and compare transistors 342 and 344 are identical to corresponding search and compare transistors of row 310, except that the gates of all transistors 342 and 344 are grounded to keep them turned off.

The current source circuit of the embodiment of FIG. 8 is now described in further detail. As previously mentioned, the current source having p-channel transistors 224 and 226 provides a small current sufficient in magnitude to maintain the VDD potential level on SPd in the absence of a miss condition current on its corresponding matchline. According to a texture of the present embodiment, this small current is a fraction of the current produced by one pair of search and compare transistors in the one state. This is achieved by applying a predetermined reference voltage Vref on the gate of p-channel transistor 224. Voltage Vmr connected to the gate of p-channel transistor 226 is a constant voltage used as an offset voltage for the cascade current mirror configuration. The generation of Vref is further discussed with reference to FIG. 13.

Figure 3:
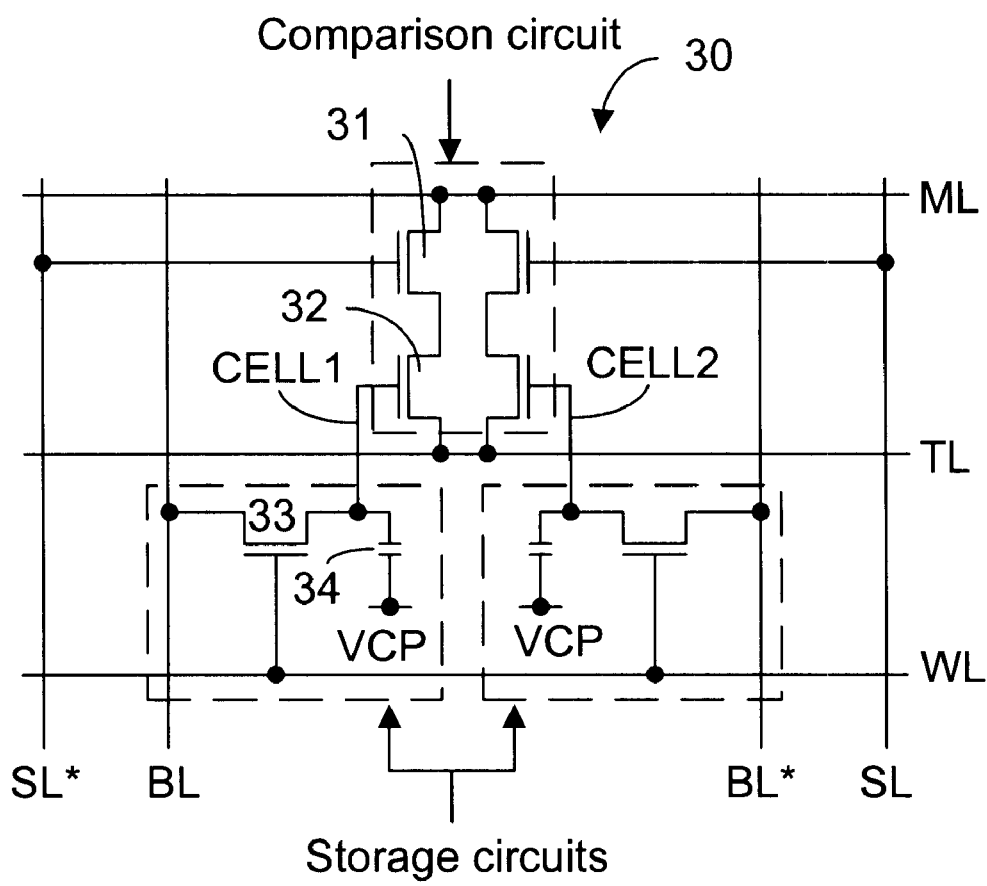
FIG. 3 is a circuit schematic of a DRAM based CAM cell.
Figure 13:
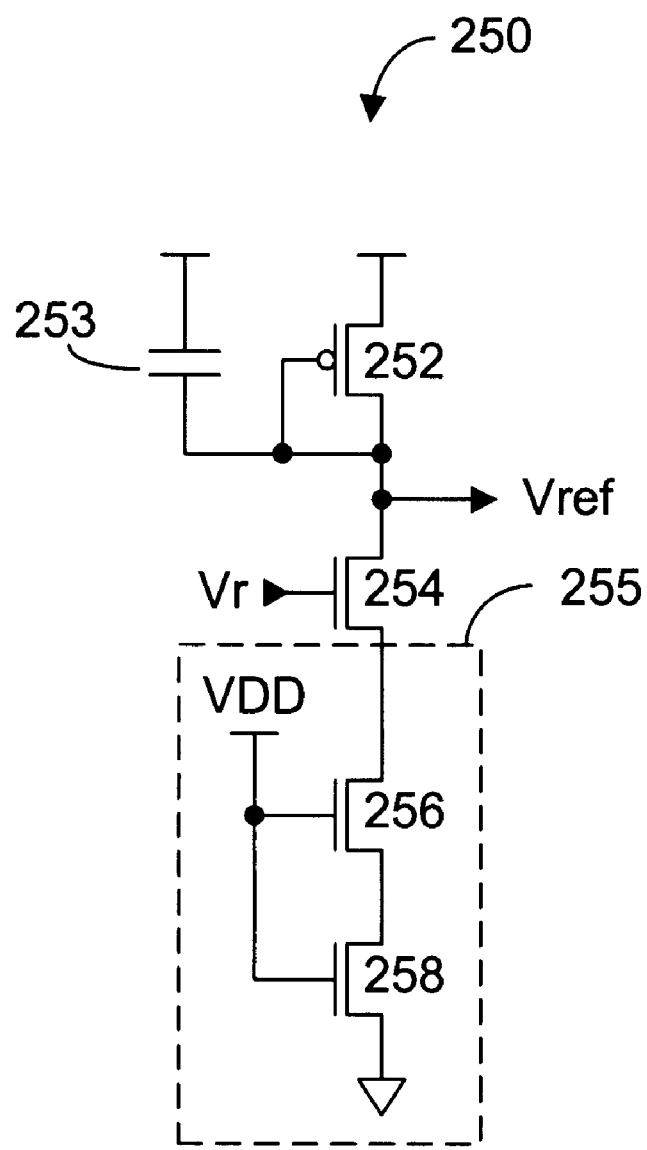
FIG. 13 shows a circuit schematic of a reference current source for providing a reference current to the matchline sense amplifier circuit of FIG. 8.

FIG. 13 is a circuit schematic embodiment of a voltage reference circuit for providing Vref. The reference voltages Vref and Vmr are provided to all MLSA (matchline sense amplifier) circuits as well as the reference MLSA circuits. Voltage reference circuit 250 includes a p-channel diode connected load transistor 252 and a reference voltage limiting n-channel transistor 254 serially connected between VDD and a dummy cell 255. Vref is coupled to VDD through capacitor 253. Dummy cell 255 includes two n-channel transistors 256 and 258 connected in series between the source terminal of transistor 254 and ground. Transistors 256 and 258 are constructed identically to a normal pair of search and compare transistors, such as search and compare transistors 31 and 32 of FIG. 3. The gate terminal of reference voltage limiting n-channel transistor 254 is connected to predetermined voltage Vr, and the gate terminals of transistors 256 and 258 are connected to VDD. Because the dummy search and compare transistors 256 and 258 are the same as normal search and compare transistors, the current they generate will be the same. Furthermore, changes in the operating conditions will affect both the normal and dummy search and compare transistors in the same way. The current of transistor 224 can be increased or decreased in the design stage by scaling the W/L ratio of transistors 224 and 252. In the present embodiment, the current through transistor 224 can be changed by scaling its W/L ratio as a factor of the W/L ratio of transistor 252. For example, the W/L ratio of transistors 224 can be between 0.1 to 0.5 the W/L ratio of transistor 252. Vr is provided by a separate voltage generator (not shown), and is determined as the difference between a voltage level at which one pair of search and compare transistors develops a pull-down current large enough to be sensed and the threshold voltage of transistor 216 from FIG. 13. Vr is typically about 0.4 to 0.5 volts.

The power saving features of the present embodiment are now described. The sensing cycle typically begins at a clock pulse but ends before the subsequent clock pulse, leaving idle time between the end of the sense cycle and the beginning of the next clock pulse. Therefore if transistor 216 of FIG. 8 remained in the on state or was not present in the circuit, state power is continually consumed in matchlines having the miss condition because of the path to ground in the matchline MLp. By turning off transistor 216 shortly after the sense cycle ends, the current source is disconnected from the path to ground in the miss condition matchline. Voltage limiting transistor 222, and similarly transistor 214, having its gate terminal connected to Vr isolates the full VDD potential of SPd from MLp, and limits MLp to about Vr. Therefore, the voltage swing of MLp is always limited to Vr during the entire sense cycle and power consumption due to repeated charge and discharge of MLp is minimized.

The matchline sense amplifier embodiment of the present invention is a compact circuit consisting of no more than eight transistors for fitting into the tight pitch CAM core layout. The circuit can sense small currents of about 10 µA within a short clock cycle, and limits matchline voltage levels to a low level for reducing power dissipation.

Therefore, as shown by the embodiments of the present invention, a low power CAM array can be achieved by segmenting matchlines into a pre-search array and a main search array, and implementing a sensing scheme where the matchlines of the pre-search and main search arrays are first precharged to a precharge level and then biased to an operating point before matchline data is sensed by matchline sensing circuitry. Additionally, by segmenting matchlines into two shorter matchlines, the parasitic capacitance and resistance encountered by each matchline sense amplifier is reduced. Therefore, less power is consumed and matchline sensing speed can be improved.

Of course, numerous variations and adaptations may be made to the particular embodiments of the invention described above, without departing from the spirit and scope of the invention, which is defined in the claims.

While the matchline sense circuit of the present invention has been implemented and simulated using CMOS technology on silicon, alternative embodiments can be implemented in other technologies such as BiCMOS. In alternative embodiments, the matchlines can be segmented into three or more segments and associated pipeline latch stages with a matchline sense amplifier output forward feeding into the next matchline sense amplifier to enable further sensing.

The above-described embodiments of the invention are intended to be examples of the present invention. Alterations, modifications and variations may be effected the particular embodiments by those of skill in the art, without departing from the scope of the invention which is defined solely by the claims appended hereto.

What is claimed is:

1. A content addressable memory CAM array comprising:
   a matchline divided into a plurality of segments, each of the plurality of segments simultaneously precharged to a precharge voltage level in a precharge phase; and
   a matchline sense amplifier associated with each of the segments for sensing current from its associated segment in a sensing phase, one matchline sense amplifier enabling another matchline sense amplifier when a match condition is detected by the one matchline sense amplifier.

2. The CAM array of claim 1, wherein timing circuits control precharge and sensing operations of the matchline sense amplifiers.

3. The CAM array of claim 2, wherein the timing circuits include reference matchlines.

4. The CAM array of claim 1, wherein the precharge voltage level corresponds to a miss condition.

5. The CAM array of claim 1, wherein the precharge voltage level is ground.

6. The CAM array of claim 1, wherein the matchline includes a first and a second matchline segment.

7. The CAM array of claim 6, wherein the matchline sense amplifier associated with the first matchline segment enables the matchline sense amplifier associated with the second matchline segment.

8. The CAM array of claim 7, wherein the first matchline segment is coupled to fewer content addressable memory cells than the second matchline segment.

9. The CAM array of claim 1, wherein the output of each matchline sense amplifier is stored in a latch circuit.

10. A method of searching a content addressable memory (CAM_ having a plurality of rows of CAM cells, each row having fist and second matchline segments, the method comprising:
    (a) precharging the first and second matchline segments to a potential level corresponding to a miss condition during a precharge phase;
    (b) establishing a biasing potential on the first matchline segment in each row of CAM cells during a sensing phase;
    (c) sensing current in the first matchline segment during the sensing phase; and
    (d) selectively enabling sensing of current in the second matchline segment in each row of CAM cells if the sensed current in the first matchline segments corresponds to a match condition between the search data and the stored data.

11. The method of claim 10, wherein the step of selectively enabling sensing includes converting the sensed current into a sense node output voltage.

12. The method of claim 11, wherein the step of selectively enabling sensing includes latching the sense node output voltage for pipelined sensing of current in the first and the second matchline segments.

* * * * *